US006936505B2

(12) United States Patent
Keys et al.

(10) Patent No.: US 6,936,505 B2
(45) Date of Patent: Aug. 30, 2005

(54) METHOD OF FORMING A SHALLOW JUNCTION

(75) Inventors: Patrick H. Keys, Beaverton, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 10/442,532

(22) Filed: May 20, 2003

(65) Prior Publication Data

US 2004/0235280 A1 Nov. 25, 2004

(51) Int. Cl.[7] ................................................ H01L 21/84
(52) U.S. Cl. ............................. 438/166; 257/69; 117/2
(58) Field of Search .................... 117/1–11; 257/49–52, 257/64–75; 438/150, 166, 174, 194, 217, 289, 525–532

(56) References Cited

U.S. PATENT DOCUMENTS 6,307,232 B1 * 10/2001 Akiyama et al. ........... 257/347
2004/0188767 A1 * 9/2004 Weber et al. ............... 257/369

OTHER PUBLICATIONS

Kennedy, E.F., et al., "Influence of $^{16}O$, $^{12}C$,$^{14}N$, and Noble Gases on the Crystallization of Amorphous Si Layers," Journal of Applied Physics, vol. 48, No. 10, Oct. 1977, pp. 4241–4246.

Murto, Robert, et al., "An Investigation of Species Dependence in Germanium Pre–Amorphized and Laser Thermal Annealed Ultra–Shallow Abrupt Junctions," IEEE, #0–7803–646207/00, 2000, pp. 182–185.

Suni, I., et al., "Influence of F and Cl on the Recrystallization of Ion–Implanted Amorphous Si," Journal of Applied Physics, vol. 56, No. 2, Jul. 15, 1984, pp. 273–278.

Talwar, Somit, et al., "Study of Laser Thermal Processing (LTP) to Meet Sub 130 nm Node Shallow Junction Requirements," IEEE, #0–7803–64620–7/00, 2000, pp. 175–177.

Talwar, Somit, et al., "Ultra–Shallow, Abrupt, and Highly–Activated Junctions by Low–Energy Ion Implantation and Laser Annealing," IEEE, #0–7803–4538–X/99, 1999, pp. 1171–1174.

* cited by examiner

*Primary Examiner*—David Nelms
*Assistant Examiner*—Calvin Lee
(74) *Attorney, Agent, or Firm*—Blakely, Sokoloff, Taylor & Zafman LLP

(57) ABSTRACT

A method of forming a shallow junction in a semiconductor substrate is disclosed. The method of one embodiment comprises preamorphizing a first region of a semiconductor substrate to a first depth and implanting recrystallization inhibitors into a second region of the semiconductor substrate. The second region is a part of the first region and has a second depth. Next, a dopant is implanted into a third region of the semiconductor substrate with the third region being a part of the second region and a first annealing is performed to selectively recrystallize the first region that has no recrystallization inhibitors. Next, a second annealing is performed to recrystallize the second region and diffuse the dopant within the second region.

29 Claims, 5 Drawing Sheets

METHOD OF FORMING A SHALLOW JUNCTION

BACKGROUND

1. Field

Microelectronics fabrication, including a method of forming a shallow junction.

2. Description of the Related Art

Advances in semiconductor devices such as Complimentary Metal Oxide Semiconductor (CMOS) devices rely on the miniaturization of the devices. Smaller devices typically equate to faster switching times, which lead to speedier and better performance. Miniaturization of the devices involves scaling down various vertical and horizontal dimensions in the device structure. For example, the thickness of the ion implanted source/drain junction of a p-type or an n-type transistor is scaled down with a corresponding scaled increase in the substrate channel doping.

For devices with a critical gate dimension in the submicron level, e.g., lesser than or equal to 0.1 μm, a shallow junction is required. Additionally, a source/drain extension junction with an abrupt profile slope is required.

The formation of source/drain extension junctions is commonly carried out by ion implantation using the appropriate dopants (e.g., boron and indium for p-type or arsenic and phosphorous for n-type). The device substrate, typically crystalline silicon, is preamorphized with ions such as silicon (Si) or germanium (Ge). Preamorphization is a process by which sufficient amounts of ions are implanted into the substrate to convert the surface region of the substrate from crystalline to amorphous. The depth of the converted region depends on the nature of the ions, ion energy, and the dose of the ions on the substrate.

FIG. 1A illustrates that a silicon substrate is preamorphized to contain an amorphous portion 102. The implantation can be controlled so that only a certain depth $D_1$ (from the top surface) of the silicon substrate is amorphized. The remaining depth of the silicon substrate remains crystalline as illustrated by crystalline portion 104. Typically, the depth $D_1$ is the desired depth for the source/drain junction of the device. A dopant source 106 such as phosphorous, arsenic, boron, or indium is implanted into a region in the amorphous portion 102.

FIG. 1B illustrates that the silicon substrate is annealed using a laser annealing process to diffuse and activate the dopant. Using the laser annealing process enables the creation of a more abrupt junction than would other types of annealing. The laser annealing process also recrystallizes (or regrows) the amorphous portion 102 into a crystalline structure. As shown in FIG. 1B, the dopant 106 fully diffuses over the amorphous portion 102 that has now recrystallized. Typically, the laser annealing process occurs at about 1200° C. to about 1400° C., or at a temperature high enough to melt amorphous silicon.

As can be seen from FIGS. 1A–1B, although the current process may result in an abrupt box-like junction it also creates defects 108 at the amorphous-crystalline interface 110, which is located in close proximity to the junction. The defects 108 are sometimes referred to as End-Of Range (EOR) dislocations. The defects 108 can create several problems for a device.

As illustrated in FIG. 1C, a device 101 is created using the process described above. The device 101 contains shallow source/drain extensions 103 created in a substrate 100 using the process described above. The device 101 also includes source/drain regions 111, a gate 105, which includes a gate oxide 107 overlying the substrate 100 and a polysilicon layer 109 overlying the gate oxide 107, all of which are created using methods well known in the art. Upon annealing, the source/drain extensions 103 are formed with defects 113 at the original amorphous-crystalline interface. The defects 113 enhance dopant diffusion resulting in a deeper source/drain extension junction and poor junction profile. The defects 113 also lead to added leakage and noise in the device. For example, the defects 113 cause leakage across the source/drain extension junction and degrade device performance.

BRIEF DESCRIPTION OF THE DRAWINGS

The disclosure is illustrated by way of example and not by way of limitation in the figures of the accompanying drawings in which like references indicate similar elements. The invention may best be understood by referring to the following description and accompanying drawings that are used to illustrate embodiments of the invention. In the drawings.

DETAILED DESCRIPTION

Figure 1A:
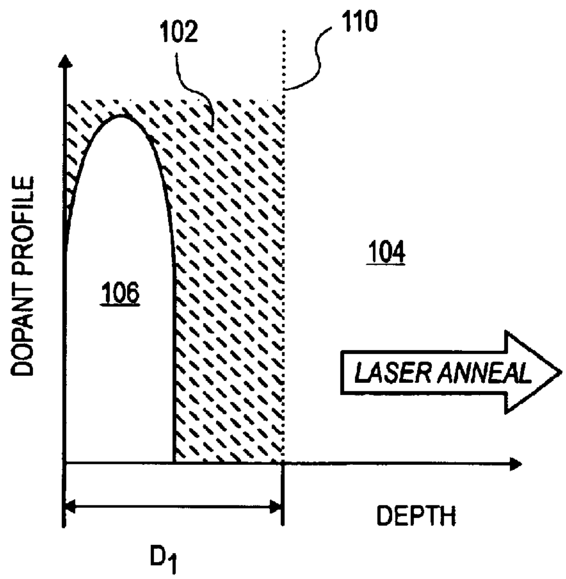
FIGS. 1A–1B illustrates an exemplary current state of the art process of forming a shallow junction.

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

From the discussion above, an improved method for making a shallow junction is desired and will be advantageous to the advancement of microelectronic devices. For example, a method of making a shallow junction that is substantially defect-free is needed. In some embodiment, a substantially defect-free shallow junction refers to a shallow junction that is formed not in close proximity with EOR dislocations or other defects or that is formed in an area, which does not have EOR dislocations. As mentioned above, EOR dislocations often result from preamorphizing and recrystallizing a semiconductor substrate.

In one embodiment, a method of forming a shallow junction in a semiconductor substrate is disclosed. The method comprises preamorphizing a first region of a semiconductor substrate to a first depth. Next, the method comprises implanting recrystallization inhibitors into a second region of the substrate with the second region being a part of the first region. The second region has a second depth. The method next comprises implanting a dopant into a third region of the semiconductor substrate with the third region being at least a part of the second region. The substrate is annealed the first time to partially selectively recrystallize the first region, which has no recrystallization inhibitors. The implantation of dopant into the third region can occur before or after the substrate is annealed the first time. The substrate is then annealed the second time using a laser annealing process to recrystallize the second region and to diffuse the dopant within the second region. The first anneal occurs at a temperature that is sufficient (or sufficiently low) to partially recrystallize the first region. In one embodiment, the first anneal can occur at a temperature that is substantially lower than the second anneal. The first depth of the first region is deeper than the second depth of the second region.

Recrystallization inhibitors are impurities that reduce the regrowth or recrystallization rate of amorphized semiconductor material such as silicon. Examples of recrystallization inhibitors include fluorine (F), nitrogen (N), carbon (C), oxygen (O), neon (Ne), argon (Ar), and krypton (Kr). Thus, when the top region of a silicon substrate is preamorphized, the top region becomes amorphous. Having the recrystallization inhibitors implanted into the amorphous region retards or inhibits the regrowth or recrystallization of the amorphous region. Implanting the recrystallization inhibitors allows for a better control in forming a shallow junction in that the recrystallization inhibitors inhibits or retard the recrystallization of a certain region of the substrate. Only the region that contains no recrystallization inhibitors is recrystallized during the first anneal. The first anneal creates EOR dislocations that are far away from the final junction. The dopant is contained in the region that has the recrystallization inhibitors since it is the region that remains amorphous after the first anneal. The EOR dislocations are thus located deeper in the substrate and away from the shallow junction area. Additionally, the recrystallization inhibitors enable subsequent film deposition processes to occur at a higher temperature and longer time without worrying about causing uncontrollable recrystallization. The film deposition step can be used as the first anneal.

In one embodiment, a semiconductor device is formed. The semiconductor device comprises a semiconductor substrate having an insulation layer disposed thereon and a gate electrode located on the insulation layer. The semiconductor substrate includes amorphizing ions and recrystallization inhibitors having been implanted into a region of the substrate. In one embodiment, the recrystallization inhibitors and the amorphizing ions are implanted at a tilt angle. The amorphizing ions are implanted deeper into the substrate than the recrystallization inhibitors. The source/drain extensions are formed within a region of the substrate that includes the recrystallization inhibitors. When the semiconductor substrate is subjected to a first annealing only the region including the amorphizing ions without the recrystallization inhibitors is recrystallized while the region including the recrystallization inhibitors remains amorphous. Dopants for the source/drain extensions are implanted into the region that includes the recrystallization inhibitors. When the semiconductor substrate is subjected to a second annealing, optimally via laser, the region that includes the recrystallization inhibitors now recrystallizes and the dopants diffuse within this region. If EOR dislocations are formed, they are formed deeper in the substrate during the first annealing. The source/drain extension regions are thus formed in a substantially defect-free region of the substrate.

Figures 2A, 2B, 2C:
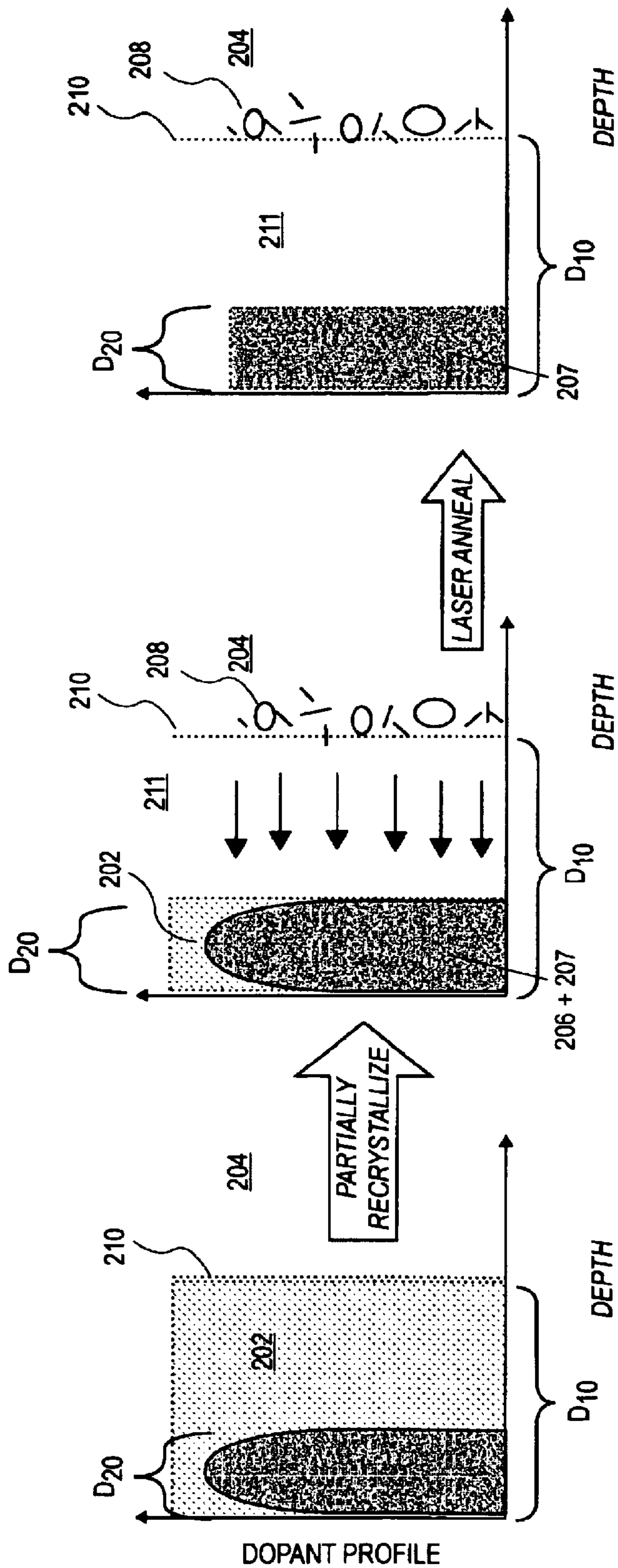
FIGS. 2A, 2B, and 2C illustrate an exemplary process scheme of forming a shallow junction in accordance with some embodiments of the present invention.

FIGS. 2A–2C illustrate an exemplary embodiment of making a shallow junction. In FIG. 2A, amorphizing ions are implanted into a semiconductor substrate to form an amorphous region 202. The process is referred to as preamorphizing the substrate. The remaining region of the semiconductor substrate is referred to as a crystalline region 204. An interface 210 is formed between the amorphous region 202 and the crystalline region 204.

In one embodiment, the amorphizing ions are implanted into the substrate to a particular depth, depth $D_{10}$. In one embodiment, the substrate is monocrystalline silicon. The implantation of the amorphizing ions into the substrate causes the substrate to lose its solid state structure and turns into an amorphous structure. The depth $D_{10}$ may be greater than about 0.1 μm, between about 0.1 μm and about 10 μm, and in one embodiment, between about 0.5 μm and about 2 μm. The semiconductor substrate can be, but is not limited to, a silicon material, germanium material, gallium arsenide material, silicon germanium, silicon carbide, silicon-on-insulator, or mixtures thereof. In this figure, the amorphizing ions are implanted into a region of the semiconductor substrate to create the amorphous region 202. The amorphizing ions can be selected from, but is not limited to, a group consisting of silicon (Si), germanium (Ge), tin (Sn), lead (Pb) and mixtures thereof. The amorphizing ions can be the same or different from the semiconductor substrate. In one embodiment, the amorphizing ions are silicon ions and the semiconductor substrate is silicon. Implanting the amorphizing ions into the substrate can be carried out using a high-energy implantation. In one embodiment, the implantation of the amorphizing ions is carried out with an energy between about 10 keV and about 200 keV and a temperature between about −200° C. to about 23° C. In another embodiment, the implantation of the amorphizing ions is carried out with an energy of about 50 keV to about 100 keV. In one embodiment, a dose between about $1\times10^{14}$ and $1\times10^{16}$ atoms/cm$^2$ of the amorphizing ions is implanted into the substrate to form the amorphous region 202. In another embodiment, a dose of about $1\times10^{15}$ atoms/cm$^2$ of the amorphizing ions is implanted into the substrate to form the amorphous region 202.

As illustrated in FIG. 2A, recrystallization inhibitors 206 are implanted into the substrate to a particular depth, depth $D_{20}$. The depth $D_{20}$ is about 10 times less than the depth $D_{10}$. In one embodiment, the depth $D_{20}$ is less than about 0.01–0.02 μm. The recrystallization inhibitors 206 are implanted into an area in the amorphous region 202 as illustrated in FIG. 2A. The recrystallization inhibitors 206 are thus implanted into an area of the substrate that includes the amorphizing ions. Implantation of the recrystallization inhibitor 206 may follow after the implantation of the amorphizing ions. The recrystallization inhibitors 206 are impurities that are non-electrically active and that are capable of inhibiting or substantially retarding the solid phase epitaxial regrowth (or recrystallization) of a semiconductor substrate that has been preamorphized, for example, as discussed above. The recrystallization inhibitors 206 inhibit the recrystallization without degrading the electrical conductance of a highly doped layer that is formed after activation (e.g., annealing). The recrystallization inhibitors 206 allow for greater control since they allow for selective or partial recrystallization of the amorphous region 202. Since the area with the recrystallization inhibitors will not regrow or recrystallize at the same rate as the area without the recrystallization inhibitors, controlling the recrystallization parameters such as annealing condition and temperature will allow for selective recrystallization. Selective recrystallization allows for the defects that are formed upon annealing at the interface 210 to be spatially separated from the region ($D_{20}$) that will be used to form source/drain junctions and/or source/drain extensions.

The recrystallization inhibitors can be selected from a group consisting of oxygen (O), nitrogen (N), carbon (C), neon (Ne), argon (Ar), krypton (Kr), fluorine (F), chlorine (Cl) ions, and mixtures thereof. The energy for the implantation of the recrystallization inhibitor ions can be varied between about 5 keV and about 300 keV. The appropriate energy is chosen so that the implantation gives the desired depth $D_{20}$ for the recrystallization inhibitor 206. The recrystallization inhibitor ions can be implanted at a temperature between about −200° C. to about 23° C. In one embodiment, the desired depth $D_{20}$ is about 500–2000 Å (0.05–0.2 $\mu$m). In another embodiment, the depth $D_{10}$ is substantially deeper (or greater) than the depth $D_{20}$, for example, the depth $D_{10}$ is twice the depth of the depth $D_{20}$. In one embodiment, a dose between about $1\times10^{12}$ and $1\times10^{18}$ atoms/cm$^2$ of the recrystallization inhibitors 206 is implanted into the substrate. In another embodiment, a dose about $1\times10^{15}$ atoms/cm$^2$ of the recrystallization inhibitors 206 is implanted into the substrate.

FIG. 2B illustrates that appropriate highly conductive dopants 207 can be implanted into a region of the amorphous region 202 that includes the recrystallization inhibitor region 206 to create shallow source/drain extensions. In other embodiments, highly conductive dopants 207 can be implanted into a region of the amorphous region 202 that includes the recrystallization inhibitor region 206 to create shallow junctions. In one embodiment, the dopants 207 are implanted into this region to a depth of about 10 Å to about 500 Å. In another embodiment, the dopants 207 are implanted into this region for the entire depth $D_{20}$ as illustrated in FIG. 2B. The appropriate dopants 207 include boron, indium, phosphorous, or arsenic depending on the type (n/p) of the junction or the source/drain extensions to be formed. The dopants 207 can be implanted at a temperature between about −200° C. and about 23° C. and with an energy of about 100 eV to about 20 keV. The recrystallization inhibitors inhibit or retard the recrystallization of the amorphous region 202 that includes the recrystallization inhibitors 206 thus allowing for the control of the recrystallization process that can selectively recrystallize only the amorphous region 202 that does not have the recrystallization inhibitors 206. The recrystallization inhibitors 206 thus enable two separate annealing processes, one to recrystallize the amorphous region 202 that does not have the recrystallization inhibitors 206 and one to recrystallize the amorphous region 202 that includes the recrystallization inhibitors 206. The first recrystallization process can also be referred to as a partial or selective recrystallization.

In one embodiment, upon the partial recrystallization, the amorphous region 202 that does not have the recrystallization inhibitors 206 recrystallizes to form the recrystallized region 211. In one embodiment, the recrystallized region 211 is a single crystalline region. The amorphous region 202 with the recrystallization inhibitors 206 remains amorphous after the partial recrystallization. The dopants 207 are confined in the amorphous region 202 that includes the recrystallization inhibitors 206 since this region remains amorphous after the partial recrystallization. Confining the dopants 207 in this region allows the source/drain extensions or junctions that will be formed here to be shallow and abrupt. Partial recrystallization may be done using conventional methods such as thermal annealing or rapid thermal annealing. In one embodiment, the partial recrystallization occurs at a temperature between about 400° C. and 800° C. for about 5–120 seconds. It is to be noted that short times may be used if partial recrystallization is achieved at such shorter time for the partial recrystallization. The temperature and time for the partial recrystallization are the temperature and time at which only the amorphous region 202 having no recrystallization inhibitors 206 can recrystallize. The temperature and time for the partial recrystallization can be determined based on the expected regrowth rate for the amorphous region 202 that contains no recrystallization inhibitors 206 and the amorphous region that contains recrystallization inhibitors 206.

It is to be appreciated that the dopants 207 can be implanted into the region with the recrystallization inhibitors 206 either before or after the partial recrystallization process. Thus, as illustrated in FIGS. 2A–2B, the substrate can be annealed to partially recrystallize the amorphous region 202 followed by implanting the dopants 207 into the amorphous region 202 that includes the recrystallization inhibitors 206. Alternatively, the dopants 207 can be implanted into the amorphous region 202 to a desired concentration that includes the recrystallization inhibitors 206 before the annealing that partially recrystallizes the amorphous region 202. In one embodiment, the desired concentration for the dopants 207 includes boron or indium ions with a dose between about $1\times10^{12}$ to about $1\times10^{16}$ atoms/cm$^2$. In another embodiment, the dopants 207 include phosphorous or arsenic ions with a dose between about $2\times10^{12}$ to about $5\times10^{12}$ atoms/cm$^2$. The dopants 207 can be implanted with an energy between about 5 keV to about 150 keV.

FIG. 2B also illustrates that the substrate is annealed (first annealing) to partially recrystallize the amorphous region 202 to form the recrystallized region 211. When the recrystallized region 211 is recrystallized after the first annealing, defects (EOR dislocations) 208 are formed at the interface 210. The defects 208 are spatially separated from the amorphous region 202 that contains the recrystallization inhibitors 206 and the dopants 207 where the shallow junction, source/drain extensions or source/drain regions of a device may be formed. The shallow junctions or the source/drain extensions of the device are thus formed spatially away from the EOR dislocations. For example, the shallow junctions or the source/drain extensions of the device can be formed to a depth that is substantially smaller (e.g., about 10 times smaller) than the depth $D_{10}$ shown in FIGS. 2A–2C. In another embodiment, the shallow junctions or the source/drain extensions of the device can be located at about at least 50 nm away from the EOR.

Figure 1B:
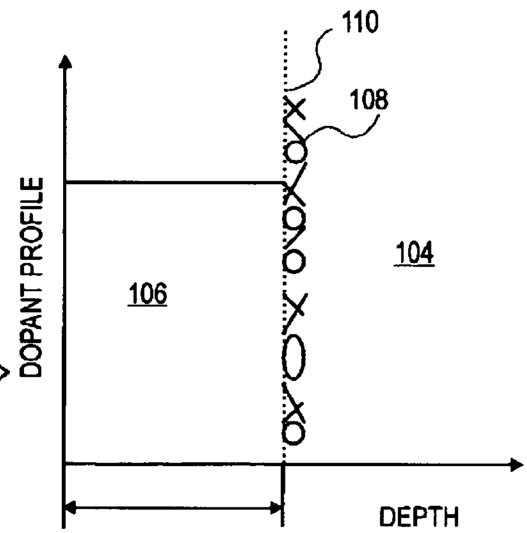
Figure 1C:
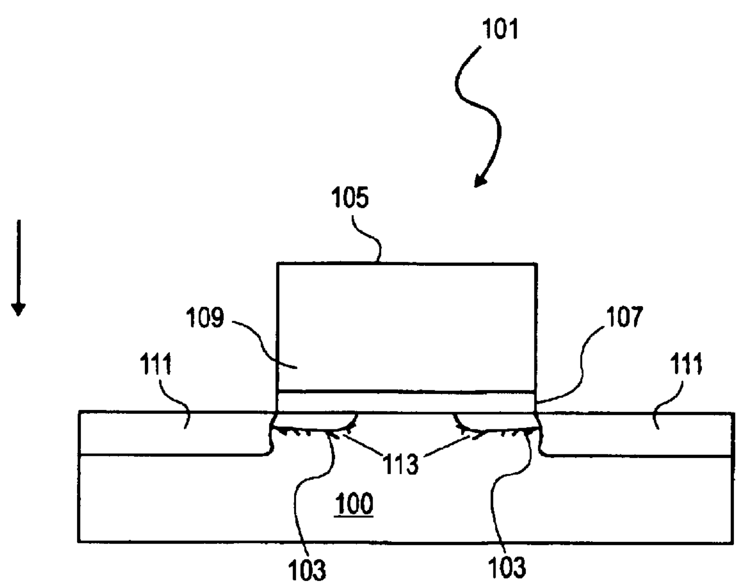
FIG. 1C illustrates an exemplary device that includes a shallow junction formed using the current state of the art process illustrated in FIGS. 1A–1B.

One difference between these embodiments and the current state of the art process is that in the current state of the art process, shallow junctions, shallow source/drain extensions, or source/drain regions are formed in the area that is in close proximity to the defects 208 as illustrated in FIGS. 1A–1C; and in the embodiments discussed, the defects 208 are spatially located away from the shallow junctions or source/drain extensions. The exemplary embodiments of the present invention perform a two-step annealing process in conjunction with the use of recrystallization inhibitors. The first annealing recrystallizes only the amorphous region 202 having no recrystallization inhibitors 206. The second annealing recrystallizes the amorphous region 202 that includes the recrystallization inhibitors 206 and diffuses the dopants 207 only within this region. The dopants 207 are thus contained within the region that includes the recrystallization inhibitors 206. These embodiments further allow for the control of the dopants and the location of the defects 208. The dopants regions used for forming the shallow junctions, shallow source/drain extensions, or source/drain regions are thus substantially defect free or are spatially separated from the defects 208. For instance, the defects 208 may be formed at a depth of about 0.1 μm while the shallow junctions, source/drain extensions, or source/drain regions may be formed at a depth of about 0.01 μm.

FIG. 2C illustrates that upon a second annealing, the dopants are diffused during melt within the amorphous region 202 that contains recrystallization inhibitors 206 forming an abrupt junction. In one embodiment, the second annealing is done with a laser annealing process. The laser annealing process preferentially melts the remaining of amorphous region 202 in the substrate due to its lower melting temperature as compared to the crystalline region 204 and the recrystallized region 211. Melting the amorphous region 202 also allows the dopants 207 to evenly distribute into the amorphous region 202. As illustrated in FIG. 2C, the abrupt junction is spatially located from the defects 208 and is thus substantially defect-free. The defects 208 are located outside the space-charge-region of the junction thus reducing deleterious leakage and noise effects.

The laser annealing process is well known in the art. In one embodiment, the laser annealing process is carried out with a 308 nm XeCl excimer laser with a pulse length of about 20 ns. The laser energies can be varied from about 0.20 J/cm$^2$ to about 0.875 J/cm$^2$ and in one embodiment, between about 0.30 J/cm$^2$ to about 0.68 J/cm$^2$. The laser annealing process can occur at a temperature between about 1200° C. and about 1400° C. The laser annealing process may require only a few seconds (e.g., nanoseconds to microseconds of exposure time) but the entire rastering process may take several minutes to process an entire wafer substrate in some embodiments. In one embodiment, the laser annealing process may take approximately 1–5 minutes.

Figure 3:
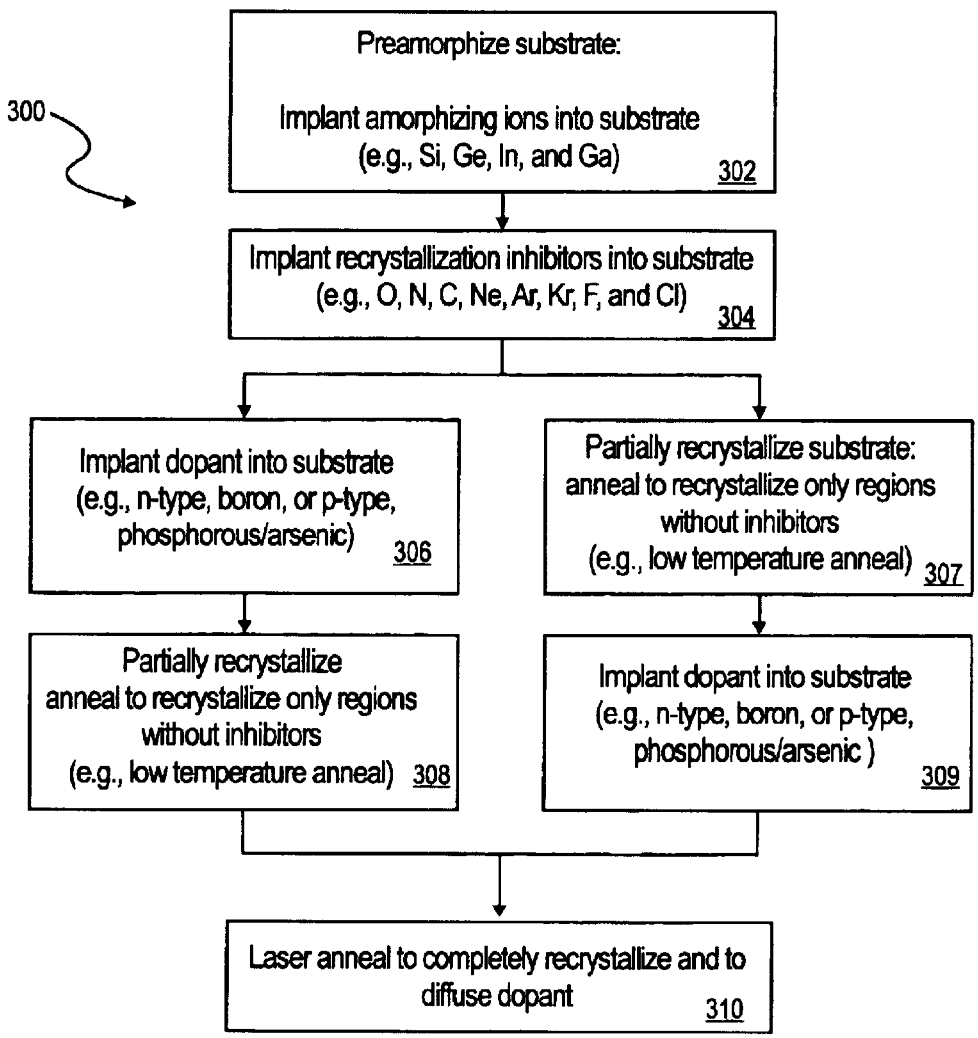
FIG. 3 illustrates an exemplary method of forming a shallow junction in accordance with some embodiments of the present invention.

FIG. 3 illustrates an exemplary method 300 of forming a shallow junction in accordance with some embodiments of the present invention. At operation 302, a substrate is preamorphized. The substrate can be preamorphized by implanting amorphizing ions such as Si, Ge, In, Ga, and mixtures thereof as previously described. The amorphizing ions are implanted to a first depth, preferentially, deeper than the depth that the shallow junction will ultimately be. At operation 304, recrystallization inhibitors are implanted into the substrate to a second depth. This second depth can be substantially shallower (smaller) than the first depth (e.g., the second depth is about one half the depth of the first depth). The second depth where the recrystallization inhibitors are implanted is preferentially the depth of the shallow junction that is formed. The recrystallization inhibitors can be selected from a group consisting of O, N, C, Ne, Ar, Kr, F, Cl, and mixtures thereof.

At operation 306, an appropriate dopant that is highly conductive is implanted into the substrate. The appropriate dopant includes boron, indium, phosphorous, or arsenic, depending on the type of junction that is formed. The dopant is implanted into the region of the substrate that includes the recrystallization inhibitors (e.g., the second depth). At operation 308, the substrate is partially or selectively recrystallized. The substrate is annealed (first annealing) such that only amorphous regions without the recrystallization inhibitors are recrystallized and the amorphous regions with the recrystallization inhibitors remain amorphous. In one embodiment, such annealing is carried in a low temperature environment, for example, between about 400–800° C.

The implantation of the highly conductive dopant does not need to occur prior to the partial recrystallization. In the alternative, at operation 307, the substrate is partially or selectively recrystallized. The substrate is annealed (first annealing) such that only amorphous regions without the recrystallization inhibitors are recrystallized and the amorphous regions with the recrystallization inhibitors remain amorphous. In one embodiment, such annealing is carried in a low temperature environment, for example, between about 400–800° C. Then, at operation 309, the appropriate highly conductive dopant (e.g., boron, indium, phosphorous, or arsenic) is implanted into the substrate. The dopant is implanted into the region of the substrate that remains amorphous at this point.

At operation 310, the substrate is annealed using a laser annealing process (second annealing). The laser annealing process recrystallizes the remaining amorphous area that includes the recrystallization inhibitors and diffuses the dopants. The dopants diffuse uniformly over this area that is then used to form the shallow junction.

Figure 4:
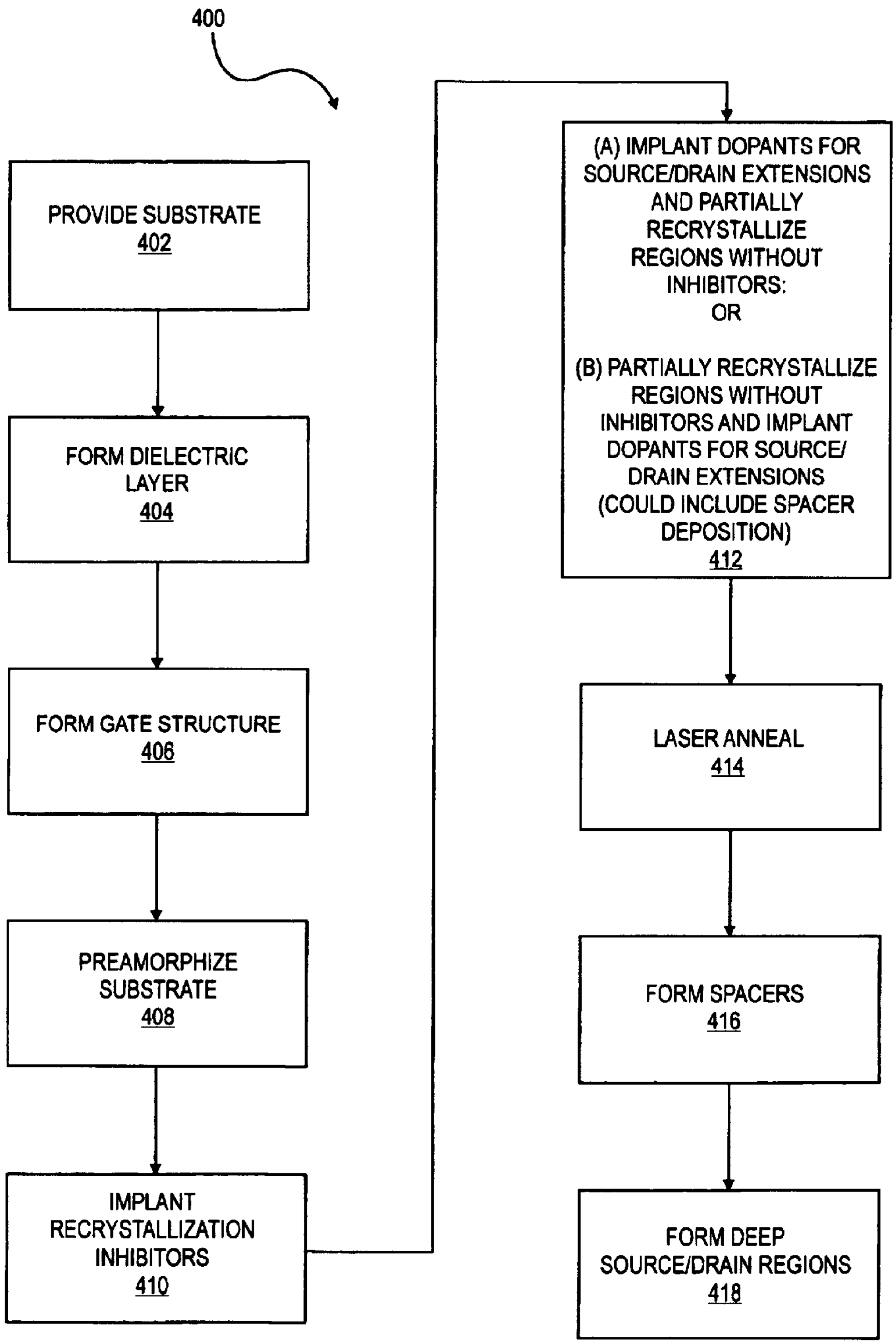
FIG. 4 illustrates an exemplary method of forming a device having a shallow junction formed in accordance with some embodiments of the present invention.
Figure 5A:
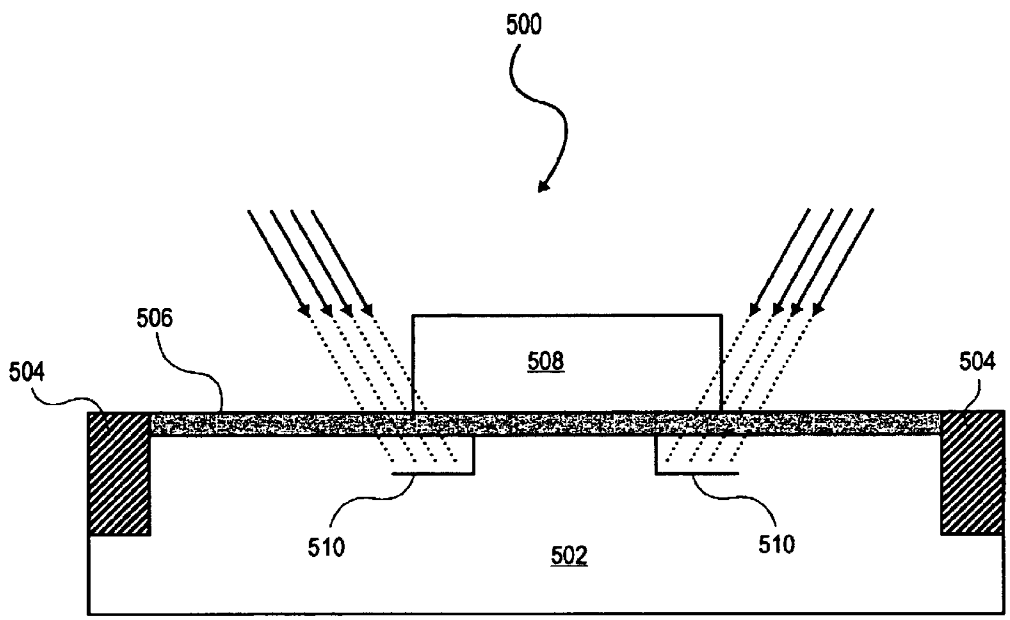
FIGS. 5A–5B illustrates cross sections of a device formed in accordance with some embodiments of the present invention.
Figure 5B:
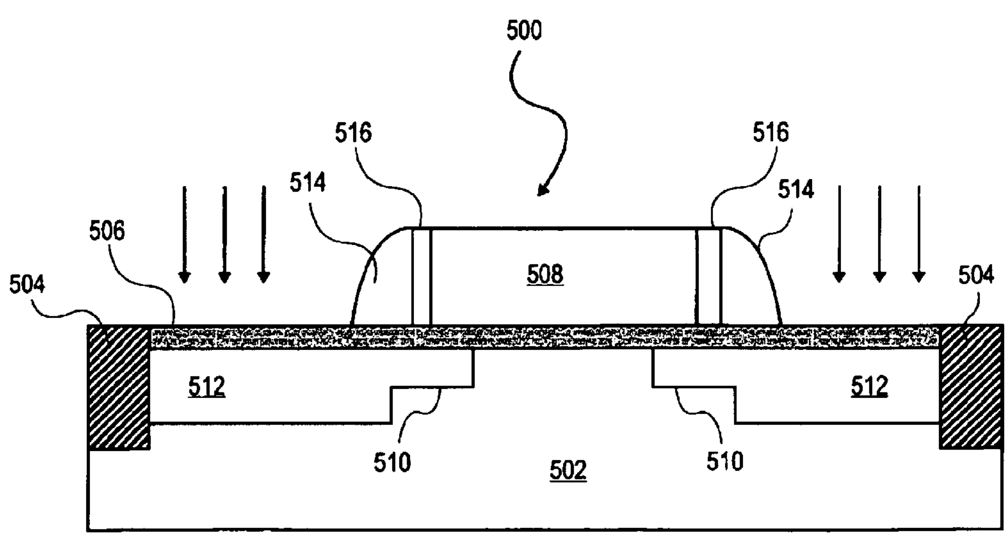

FIGS. 4, 5A, and 5B illustrate an exemplary method 400 of forming a microelectronic device 500 that includes shallow junctions. At operation 402, a substrate 502 is provided. The substrate 502 is a semiconductor substrate 502 typically used for forming microelectronic devices such as silicon, germanium, gallium arsenide, silicon germanium, silicon carbide, or mixtures thereof. The substrate 502 may include field isolation regions 504 such as shallow trench isolation regions or oxide isolation regions formed into the substrate 502 to isolate devices that are formed on the substrate 502.

At operation 404, a dielectric layer 506 is formed on the substrate 502. The dielectric layer 506 is formed using conventional methods well known in the art. In one embodiment, the dielectric layer 506 is an insulating material including $SiO_2$, $Si_3N_4$, $TiO_2$, $Al_2O_3$, mixtures thereof, and the like. At operation 406, a gate structure 508 is formed on the dielectric layer 506. The gate structure 508 includes a conductive layer deposited on the dielectric layer using conventional methods well known in the art such as chemical vapor deposition to deposit the conductive layer and photolithographic techniques to pattern the gate structure 508. Materials that can be used for the gate structure 508 include polysilicon, tungsten, chromium, copper, and the like. It is to be appreciated that the gate structure 508 needs not be formed prior to the formation of the shallow junctions and may be formed after the shallow junctions are formed using conventional methods well known in the art.

At operation 408, the top region of the substrate 502 is preamorphized using methods previously described. In one embodiment, amorphizing ions such as Si, Ge, In, Ga, and mixtures thereof are implanted into the top region of the substrate 502 to create an amorphous region. The amorphizing ions can be implanted into the top region using methods previously described. In one embodiment, the amorphizing ions are implanted at a temperature between about −200° C. to about 23° C. and with an energy between about 100 keV and about 2000 keV. The amorphizing ions are implanted to a first depth that is deeper than the depth of the shallow junctions to be formed. In one embodiment, the amorphizing ions are implanted at a tilt angle (FIG. 5A) that can be varied from about 10–40 degrees. Implanting the ions at the tilt angle reduces lateral channeling of subsequently implanted dopants. Implanting the ions at the tilt angle also allows for amorphizing regions beneath the gate structure 508. Alternatively, a mask with an appropriate pattern (not shown) can be used to allow for a more selective implantation for the amorphizing ions.

At operation 410, recrystallization inhibitors are implanted into the substrate 502 to a second depth. This second depth can be substantially shallower (smaller) than the first depth. This way, the EOR dislocations are spatially located away from the source/drain extensions, and the source/drain extensions are formed in a substantially defect-free area. The recrystallization inhibitors can be selected from a group consisting of O, N, C, Ne, Ar, Kr, F, Cl, and mixtures thereof. The second depth where the recrystallization inhibitors are implanted is preferentially the depth of the shallow junction that is formed. The recrystallization inhibitor ions can be implanted using methods previously described. In one embodiment, the recrystallization inhibitor ions are implanted at a temperature between about −200° C. to about 23° C. and with an energy between about 50 keV and about 300 keV. In one embodiment, the recrystallization inhibitor ions are implanted at a tilt angle that can be varied from about 10–40 degrees similar to the implantation of the amorphizing ions. Alternatively, a mask with an appropriate pattern (not shown) can be used to allow for a more selective implantation for the recrystallization inhibitor ions.

At operation 412, appropriate dopants (e.g., boron, indium, phosphorous, or arsenic) for source/drain extensions are implanted as previously described. Similar to the implantation of the amorphizing ions and the recrystallization inhibitor ions, the dopants can also be implanted at a tilt angle and/or with a mask. The substrate 502 is then partially recrystallized in which the substrate 502 is annealed (first annealing) such that only amorphous regions without the recrystallization inhibitors are recrystallized and the regions with the recrystallization inhibitors remain amorphous. In one embodiment, such annealing is carried at a low temperature, for example, between about 400–800° C. In the alternative embodiment, the partial recrystallization occurs prior to the implantation of the dopants. In yet another alternative embodiment, the partial recrystallization may include a spacer deposition process.

At operation 414, the substrate 502 is annealed a second time (second annealing) using a laser annealing process to recrystallize the remaining amorphous region and to diffuse the dopants. In one embodiment, the laser annealing process is carried out with a 308 nm XeCl excimer laser with a pulse length of about 20 ns. The laser energies can be varied from about 0.20 $J/cm^2$ to about 0.875 $J/cm^2$ and in one embodiment, between about 0.30 $J/cm^2$ to about 0.68 $J/cm^2$. The laser annealing process can occur at a temperature between about 1200° C. and about 1400° C.

At operation 416, sidewall spacers 514 and 516 can be formed on the gate structure by well-known techniques such as chemical vapor deposition to deposit the sidewall spacer materials and photolithography to pattern the sidewall spacers. Suitable materials for sidewall spacers 514 and 516 include silicon oxide, silicon nitride, and combinations thereof.

At operation 418, deep source/drain regions 512 can be formed into the substrate 502. The dopants for the deep source/drain regions 512 can be implanted into the substrate 502 at a dose of at least about $2\times10^{15}$ atoms/$cm^2$.

After the operation 418, if desired, the device 500 can be subjected to further processing such as silicidation of exposed silicon and polysilicon surfaces and the backend processing.

One advantage of the embodiments described is that they enable higher deposition temperatures and longer deposition times to be used between the preamorphization process, the dopant implantation process, and the recrystallization process. Another advantage is that these embodiments enable the EOR dislocations caused by the recrystallization of the amorphized substrate to be located deeper in the substrate and away from the area used for forming shallow source/drain extensions and/or shallow p-n junctions. The overall advantage of these embodiments is better device electrical performance.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed is:

1. A method of forming a shallow junction in a semiconductor substrate comprising:

preamorphizing a first region of a semiconductor substrate to a first depth;

implanting recrystallization inhibitors into a second region of said semiconductor substrate, said second region being a part of said first region and having a second depth;

implanting a dopant into a third region of said semiconductor substrate wherein said third region is a part of said second region, and performing a first annealing to selectively recrystallize said first region that has no recrystallization inhibitors; and performing a second annealing to recrystallize said second region and to diffuse said dopant within said second region.

2. The method of claim 1 wherein said second depth is smaller than said first depth.

3. The method of claim 1 wherein said preamorphizing comprises implanting amorphizing ions into said first region.

4. The method of claim 1 wherein said preamorphizing comprises implanting amorphizing ions into said first region wherein said amorphizing ions include at least one of silicon, germanium, indium, and gallium.

5. The method of claim 1 wherein said implanting recrystallization inhibitors comprises implanting at least one of oxygen, nitrogen, carbon, neon, argon, krypton, fluorine, and chlorine into said second region.

6. The method of claim 1 wherein said first annealing occurs at a substantially lower temperature than said second annealing.

7. The method of claim 1 wherein said second annealing is a laser annealing process.

8. The method of claim 1 wherein said first annealing occurs at a temperature that does not permit recrystallization of said second region that includes said recrystallization inhibitors.

9. The method of claim 1 wherein said first annealing has a temperature between about 400° C. and about 800° C.

10. The method of claim 1 wherein said first annealing occurs before said implanting said dopant into said third region.

11. A semiconductor device comprising:

a semiconductor substrate having an insulation layer disposed thereon and a gate electrode located on said insulation layer, said semiconductor substrate includes amorphizing ions and recrystallization inhibitors having been implanted into a region of said substrate, said amorphizing ions having been implanted deeper into said substrate than said recrystallization inhibitors; and source/drain extensions formed within said region of said substrate that includes said recrystallization inhibitors, said source/drain regions are formed in a substantially defect-free region of said substrate.

12. The semiconductor device of claim 11 wherein said amorphizing ions and recrystallization inhibitors are implanted into said region of said substrate at a tilt angle.

13. The semiconductor device of claim 11 wherein said recrystallization inhibitors include at least one of oxygen, nitrogen, carbon, neon, argon, krypton, fluorine, and chlorine.

14. The semiconductor device of claim 11 wherein said amorphizing ions include at least one of silicon, germanium, indium, and gallium.

15. The semiconductor device of claim 11 further comprising: deep source/drain regions formed in said substrate.

16. The semiconductor device of claim 11 further comprising: sidewall spacers formed on said gate electrode.

17. A semiconductor device comprising:

a semiconductor substrate having an insulation layer disposed thereon and a gate electrode located on said insulation layer, said semiconductor substrate includes amorphizing ions and recrystallization inhibitors having been implanted into a region of said substrate, said amorphizing ions having been implanted deeper into said substrate than said recrystallization inhibitors;

source/drain extensions formed within said region of said substrate that includes said recrystallization inhibitors, said source/drain regions are formed in a substantially defect-free region of said substrate; and wherein said source/drain regions are formed spatially away from an end-of-range dislocation.

18. A semiconductor device comprising:

a semiconductor substrate having an insulation layer disposed thereon and a gate electrode located on said insulation layer, said semiconductor substrate includes amorphizing ions and recrystallization inhibitors having been implanted into a region of said substrate, said amorphizing ions having been implanted deeper into said substrate than said recrystallization inhibitors;

source/drain extensions formed within said region of said substrate that includes said recrystallization inhibitors, said source/drain regions are formed in a substantially defect-free region of said substrate; and wherein said source/drain regions have a depth that is substantially smaller than the depth for end-of-range dislocations in said substrate.

19. A method of forming a semiconductor device comprising:

providing a substrate;

forming a dielectric layer on said substrate;

forming a gate structure located on said dielectric layer;

preamorphizing a first region of a semiconductor substrate, said first region having a first depth;

implanting recrystallization inhibitors into a second region of said semiconductor substrate, said second region having a second depth that is shallower than said first depth;

performing implanting a dopant into said second region to form a source/drain extension and performing a first annealing at low temperature to selectively recrystallize said first region; and performing a second annealing to recrystallize said second region and to diffuse said dopant within said second region.

20. The method of claim 19 wherein said preamorphizing being at a tilt angle.

21. The method of claim 19 wherein said second annealing is a laser annealing process.

22. The method of claim 19 further comprises forming sidewall spacers on said gate electrode.

23. The method of claim 19 further comprises forming deep source/drain regions in said substrate.

24. The method of claim 19 wherein said preamorphizing comprises implanting amorphizing ions into said first region wherein said amorphizing ions include at least one of silicon, germanium, indium, and gallium.

25. The method of claim 19 wherein said implanting recrystallization inhibitors comprises implanting at least one of oxygen, nitrogen, carbon, neon, argon, krypton, fluorine, and chlorine into said second region.

26. The method of claim 19 wherein said first annealing occurs at a substantially lower temperature than said second annealing.

27. The method of claim 19 wherein said first annealing occurs at a temperature that does not permit recrystallization of second region which includes said recrystallization inhibitors.

28. The method of claim 19 wherein said first annealing occurs at a temperature between about 400° C. and about 800° C.

29. The method of claim 19 wherein said first annealing occurs before said implanting said dopant into said second region.

* * * * *